(12) United States Patent
Cunningham et al.

(10) Patent No.: US 7,300,814 B2
(45) Date of Patent: Nov. 27, 2007

(54) METHOD FOR FABRICATING MICRO-MECHANICAL DEVICES

(75) Inventors: Brian T. Cunningham, Urbana, IL (US); Marc S. Weinberg, Needham, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 293 days.

(21) Appl. No.: 11/014,415

(22) Filed: Dec. 16, 2004

(65) Prior Publication Data

US 2006/0134818 A1  Jun. 22, 2006

(51) Int. Cl.
*H01L 21/00* (2006.01)

(52) U.S. Cl. .......................................... 438/50; 438/52

(58) Field of Classification Search ................. 438/48, 438/52, 455, 459
See application file for complete search history.

(56) References Cited

U.S. PATENT DOCUMENTS

| | | | |
|---|---|---|---|
| 5,195,371 A | 3/1993 | Greiff | |
| 5,349,855 A | 9/1994 | Bernstein et al. | |
| 5,492,596 A | 2/1996 | Cho | |
| 5,505,084 A | 4/1996 | Greiff et al. | |
| 5,635,639 A | 6/1997 | Greiff et al. | |
| 5,672,949 A | 9/1997 | Ward | |
| 5,747,961 A | 5/1998 | Ward et al. | |
| 5,767,405 A | 6/1998 | Bernstein et al. | |
| 5,892,153 A | 4/1999 | Weinberg et al. | |
| 5,911,156 A | 6/1999 | Ward et al. | |
| 5,946,346 A | 8/1999 | Takashi | |
| 5,992,233 A | 11/1999 | Clark | |
| 6,067,858 A | 5/2000 | Clark et al. | |
| 6,155,115 A | 12/2000 | Ljung | |
| 6,230,567 B1 | 5/2001 | Greiff | |
| 6,250,156 B1 | 6/2001 | Seshia et al. | |
| 6,257,059 B1 | 7/2001 | Weinberg et al. | |
| 6,269,696 B1 | 8/2001 | Weinberg et al. | |
| 6,548,321 B1 | 4/2003 | Sawyer | |
| 6,550,329 B1 | 4/2003 | Watson | |
| 6,673,694 B2 | 1/2004 | Borenstein | |
| 7,067,344 B1 * | 6/2006 | Oguchi | 438/53 |
| 2001/0001928 A1 | 5/2001 | Kikuchi et al. | |
| 2003/0077876 A1 | 4/2003 | Sawyer | |
| 2004/0035206 A1 | 2/2004 | Ward et al. | |

FOREIGN PATENT DOCUMENTS

EP  0 280 905 A2  9/1988

OTHER PUBLICATIONS

N. Ito et al., "A Rapid and Selective Anodic Bonding Method", Jun. 1995, Transducers '95—Eurosensors IX, pp. 277-280.
J.A. Plaza, A. Llobera et al., "BESOI-Based Integrated Optical Silicon Accelerometer," *JMEMS*, vol. 13, No. 2, 2004, pp. 355-364.
J.A. Plaza, J. Esteve, and E. Lora-Tamayo, "Simple Technology for Bulk Accelerometer Based on Bond Etch Back Silicon on Insulator Wafers," *Sensors and Actuators, Physics A*, vol. 68, 1998, pp. 299-302.

* cited by examiner

*Primary Examiner*—Tuan H. Nguyen
(74) *Attorney, Agent, or Firm*—Iandiorio & Teska

(57) ABSTRACT

A method of fabricating micro-mechanical devices. A mesa is etched in a homogeneous wafer. The wafer is bonded to a patterned substrate with the mesa defining device elements suspended above the substrate. A portion of the wafer is removed until a desired device thickness is achieved. Discrete elements of the device are then formed by performing a structural etch on the remaining wafer material.

9 Claims, 11 Drawing Sheets

METHOD FOR FABRICATING MICRO-MECHANICAL DEVICES

FIELD OF THE INVENTION

The subject invention relates to methods of forming gyroscopes, accelerometers, and other devices including structure or structures suspended above a substrate.

BACKGROUND OF THE INVENTION

There are several known methods of forming gyroscopes, accelerometers, and other MEMS devices including structure suspended above a substrate.

According to commonly owned U.S. Pat. No. 5,492,596, incorporated herein by this reference, a silicon wafer is etched at desired locations to define the portions of the device which are suspended above a glass substrate. Boron is then diffused into the silicon wafer to a depth which will define the thickness of the device. The glass substrate is then prepared to include electrodes and the silicon wafer, diffused with boron, is bonded to the glass substrate. Finally, the silicon substrate is thinned by etching down to the boron diffusion layer.

The use of boron as an etch stop layer, however, may limit the thickness of the resulting device because boron diffusion is currently limited to a thickness of approximately 20 µm. Boron diffusion is limited in thickness by the long diffusion time and high diffusion temperatures required to obtain a deep diffusion profile with a boron concentration of greater than $5 \times 10^{19}$ $cm^{-3}$. The boron doping gradient generated by the diffusion process also creates a non-uniform stress gradient through the thickness of the micro-mechanical structure which has been shown to cause the structures to bend. Heavily boron doped silicon produced by diffusion is known to have a high density of dislocations caused by lattice mismatch of the boron doped layer with the undoped silicon substrate.

Deposition of thick boron doped epitaxial layers is also expensive. Heavily boron doped epitaxial layers have been demonstrated with a thickness of up to 50 µm but at a high cost (e.g., epitaxy cost can exceed $300.00 per wafer). Epitaxy costs are expected to increase as the thickness is increased. For thick epitaxial silicon deposition, the deposition process is often interrupted several times to perform chamber cleaning. Also, silicon epitaxy with boron exhibits high strains that can curl wafers. If germanium is used to lower the stress, the result is a low mechanical quality factor which is disadvantageous in many applications such as vibrating angular rate sensors and resonators.

According to commonly owned U.S. Pat. No. 6,673,694, also incorporated herein by this reference, boron diffusion is not required if a silicon-on-insulator (SOI) type wafer is used.

Still, however, the basic structure of the device is preferably formed before wafer thinning. If features such as access ports are present, wet chemical etches cannot typically be used. Thus, although the method of the '694 patent has proven useful, there is still room for improvements and/or alterations.

In addition, the EDP etch required to dissolve the undoped portions of the silicon wafer is a highly corrosive wet chemical etch necessitating special exhaust and chemical handling procedures.

Finally, sticking is a major failure mode for devices fabricated by the dissolved wafer process. Because the sensors are released in a wet chemical environment, liquid surface tension has an opportunity to draw released silicon structures to the glass substrate. After EDP silicon release, a series of wet solvent rinses are required to remove etch residues which are sometimes suspected as a cause for stiction.

SUMMARY OF THE INVENTION

It is therefore an object of this invention to provide a method of fabricating micro-mechanical devices which results in thicker structures, e.g., proof masses.

It is a further object of this invention to provide such a method which reduces dislocation caused by lattice mismatch.

It is a further object of this invention to provide such a method which is lower in cost.

It is a further object of this invention to provide to such a method which does not require special exhaust and chemical handling procedures.

It is a further object of this invention to provide such a method which reduces stiction.

It is a further object of this invention to provide such a method which eliminates or minimizes the need for highly corrosive wet chemical etches.

It is a further object of this invention to provide to such a method which results in thicker micro-mechanical structures that can be used to increase the mass and horizontal motion stiffness of micro-mechanical gyroscopes and accelerometer designs.

The subject invention results from the realization that a thicker device structure can be obtained by performing the structural etch only after the wafer is bonded to the glass substrate and after the handle layer is removed.

The subject invention, however, in other embodiments, need not achieve all these objectives and the claims hereof should not be limited to structures or methods capable of achieving these objectives.

This invention features a method of fabricating micro-mechanical devices and a resulting product. A mesa is etched in a homogeneous wafer and the wafer is bonded to a patterned substrate with the mesa defining device elements suspended above the substrate. Portions of the wafer are then removed until a desired device thickness is achieved. Then, discrete elements of the device are formed by performing a structural etch on the remaining wafer material.

In one example, the silicon wafer includes a handle portion and a device portion. The mesa is etched in the device portion and the handle portion is removed. In one example, the handle portion may be removed by grinding or by a wet chemical etch. Typically, a wet chemical etch is not used to form the discrete elements of the device or in any processing step after the discrete elements of this device are formed.

This invention also features a micro-mechanical device including elements defined in a wafer suspended above a substrate bonded to the wafer. A mesa is formed in either the wafer or the substrate. The wafer is bonded to the substrate and a portion of the wafer is removed until a desired device thickness is achieved. The discrete elements of the device are then formed by performing a structural etch on the remaining wafer material.

One exemplary method of fabricating micro-mechanical devices includes the following steps: performing a structural etch in a wafer to form discrete elements of the device without using a wet chemical etch and only after at least one of the steps of: a) bonding the wafer to a substrate, and b) removing a portion of the wafer until a desired device thickness is achieved.

Typically, the structural etch is performed after both steps a) and b) and the structural etch includes forming trenches in the wafer.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1A:
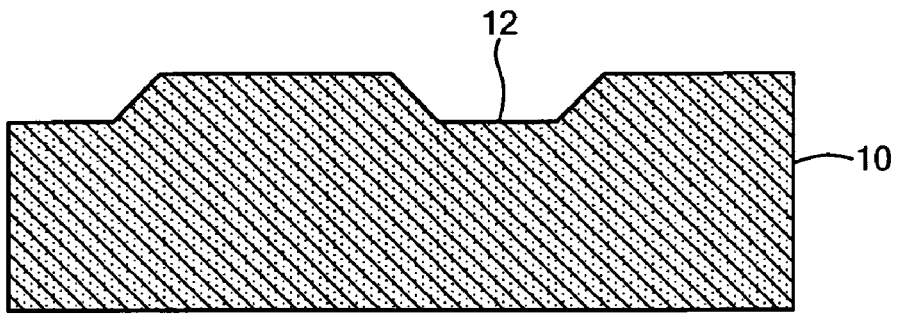
FIGS. 1A-1E are schematic cross sectional views showing the primaries steps associated with fabricating a micromechanical device in accordance with U.S. Pat. No. 5,492,596.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed briefly in the background section above, commonly owned U.S. Pat. No. 5,492,596 discloses a method of fabricating a gyroscope or other MEMS device when silicon wafer 10, FIG. 1A is etched to form recess or mesa 12. In FIG. 1A, structure below mesa 12 will be the device structure suspended above another, typically glass, substrate. In one example, the suspended structure is a proof mass or other vibrating element suspended above the substrate via anchors secured to the substrate.

Figure 1B:
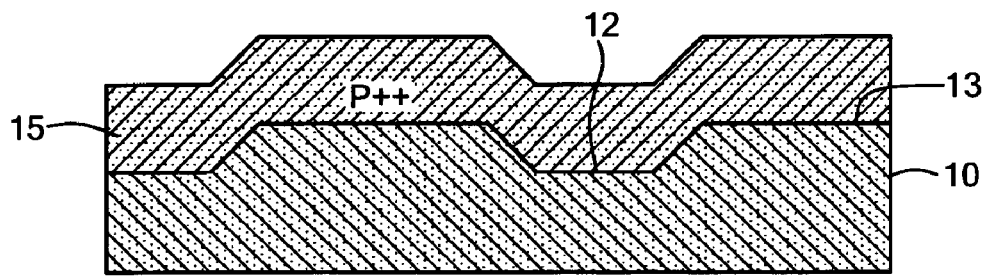
Figure 1C:
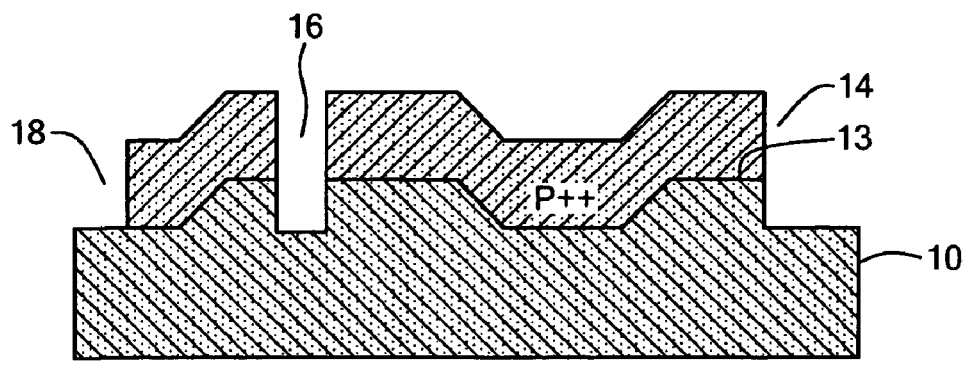
Figure 1D:
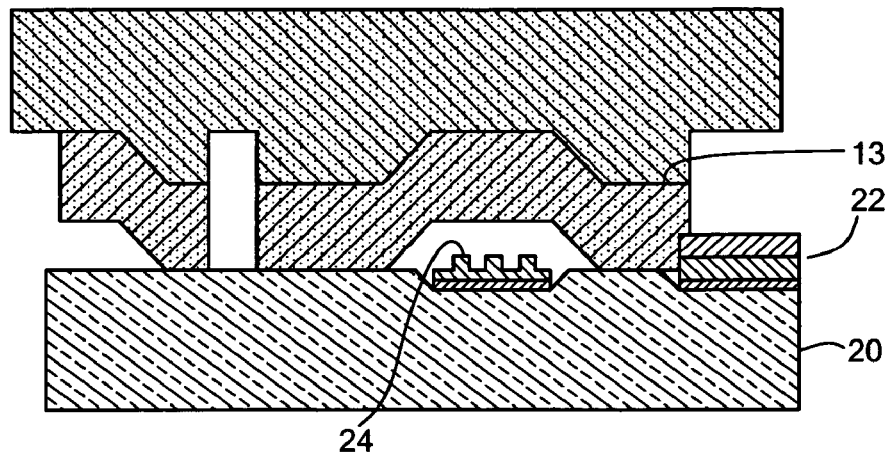
Figure 1E:
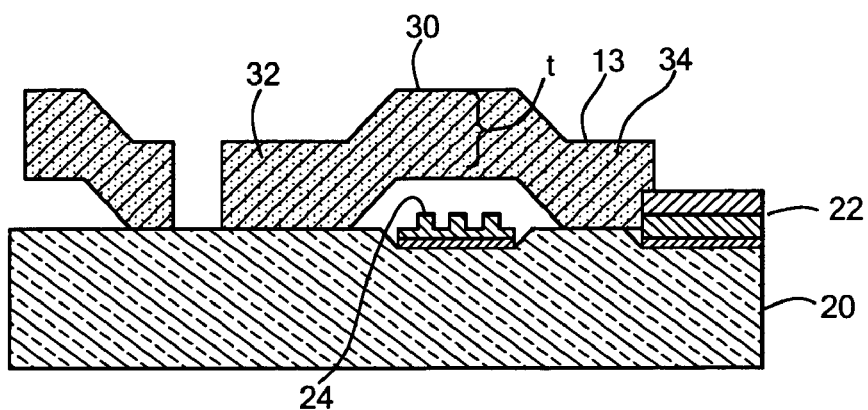

In FIG. 1B, boron is diffused into silicon substrate 10 as shown at 15 to define etch stop layer 13. In FIG. 1C, etching processes are employed as shown at 14 and 16 to define the individual elements of the device. In FIG. 1D, this substrate is bonded to glass substrate 20 previously prepared to include electrode 22 and optional standoff 24. In FIG. 1E, the silicon wafer is etched down to the boron etch stop layer 13 resulting in element 30 suspended above substrate 20 via anchor portions 32 and 34.

As delineated in the background section above, there are limits to the depth that boron can be diffused in substrate 10, FIG. 1B defining etch stop layer 13 and thus limits to the thickness t of suspended element 30, FIG. 1E, such as a proof mass.

Figure 2A:
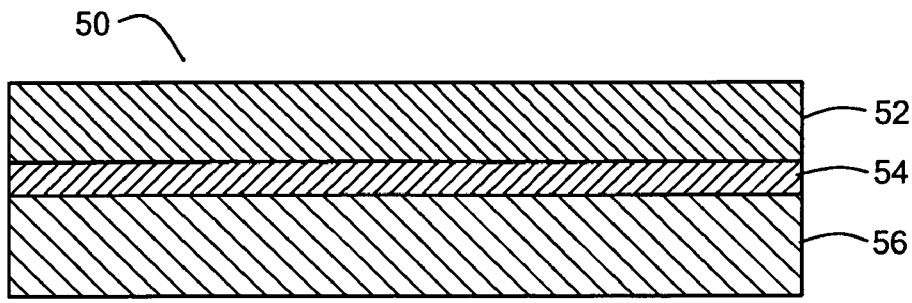
FIGS. 2A-2F are schematic cross sectional views showing the primary steps associated with fabricating a micro-mechanical structure in accordance with U.S. Pat. No. 6,673,694.
Figure 2B:
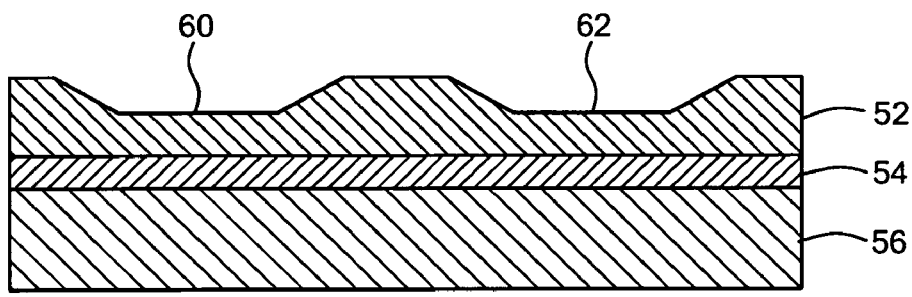
Figure 2C:
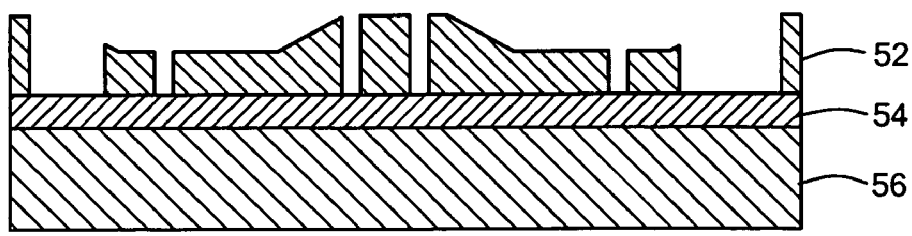

As also discussed in the background section above, commonly owned U.S. Pat. No. 6,673,694 describes a different process where SOI wafer 50, FIG. 2A is used. SOI wafer 50 includes silicon device layer 52, dielectric layer 54 (typically an oxide), and silicon "handle" layer 56. In FIG. 2B, mesa 60 and 62 are etched in device layer 52 and in FIG. 2C a structural etch is performed in device layer 52 down to oxide layer 54 as shown defining the elements which will be suspended above another substrate.

Figure 2D:
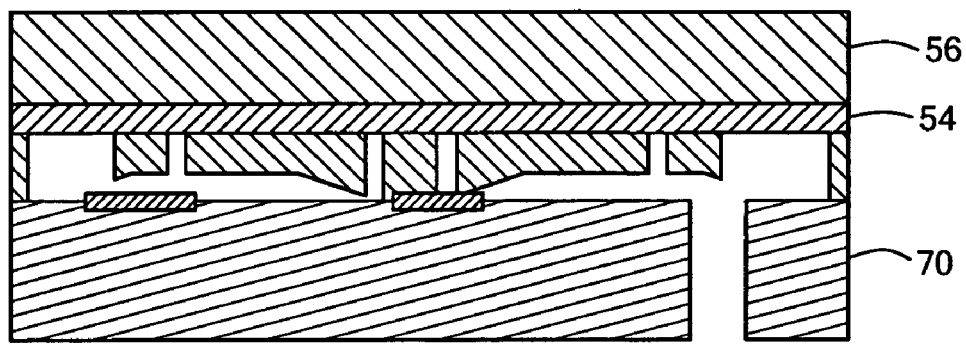
Figure 2E:
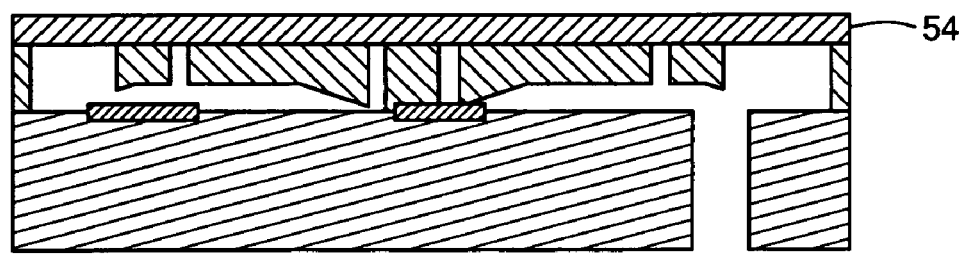
Figure 2F:
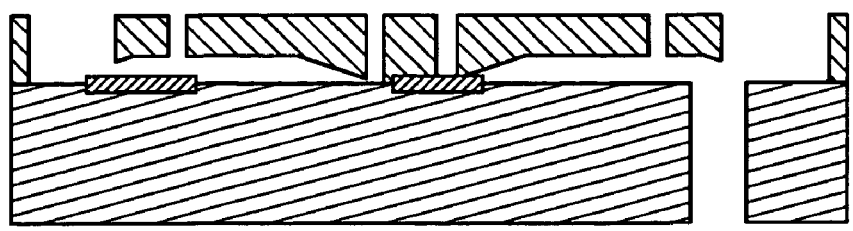

In FIG. 2D, this structure is bonded to the previously prepared glass substrate 70. In FIG. 2E, handle layer 56 is removed and in FIG. 2F oxide layer 54 is removed.

Thus, the preferred basic device structure is typically formed prior to wafer thinning and if features such as access ports are present, wet chemical etches cannot typically be used to remove handle layer 56, FIG. 2D. Moreover, the techniques for removing dielectric oxide layer 54, FIG. 2E are limited to ensure that the bulk glass and metalization on the top side of the device is not attacked by the etchant. FIG. 5 of the '694 patent depicts a "Baseline BESOI Process" wherein an SOI water is bonded to a glass substrate first before the handle layer and the dielectric layer of the SOI water are removed and then the structural etch is performed.

In accordance with the subject invention, a thicker structure can be manufactured by eliminating the need for SOI wafers or boron diffusion as a technique to define an etch stop layer and by performing the structural etch only after the wafer is bonded to the glass substrate and after the handle layer and dielectric oxide layer are removed.

Figure 3A:
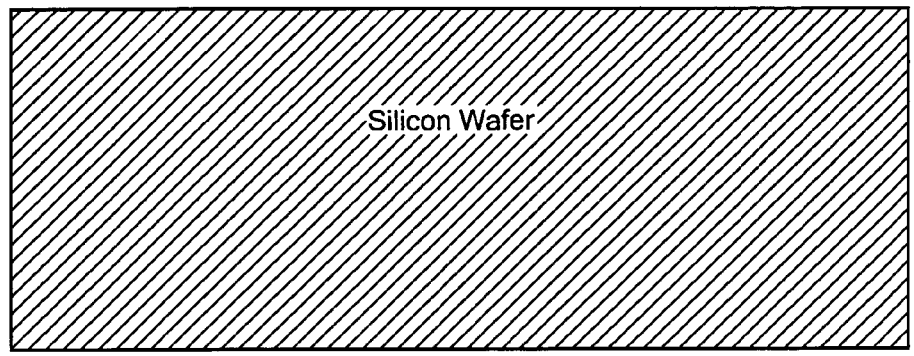
FIGS. 3A-3B are schematic cross sectional views showing the steps of forming a mesa etch in a SOI wafer in accordance with the subject invention.
Figure 3B:
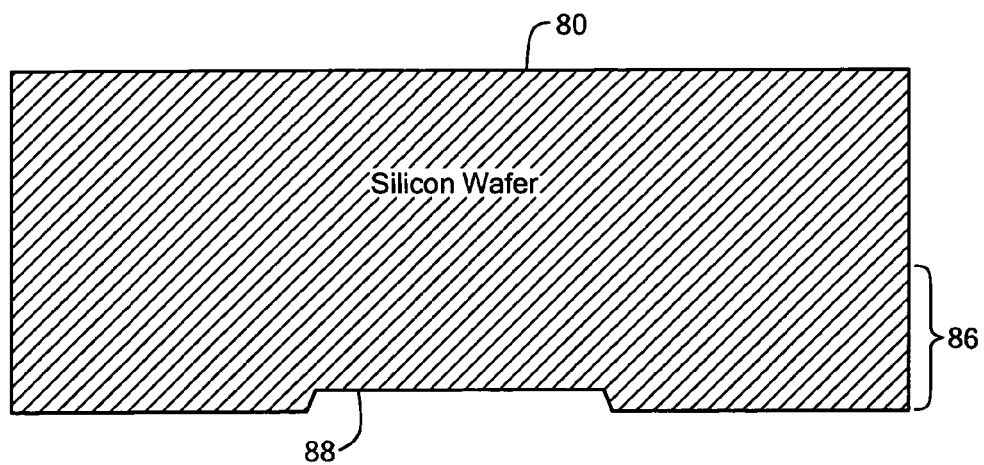
Figure 4A:
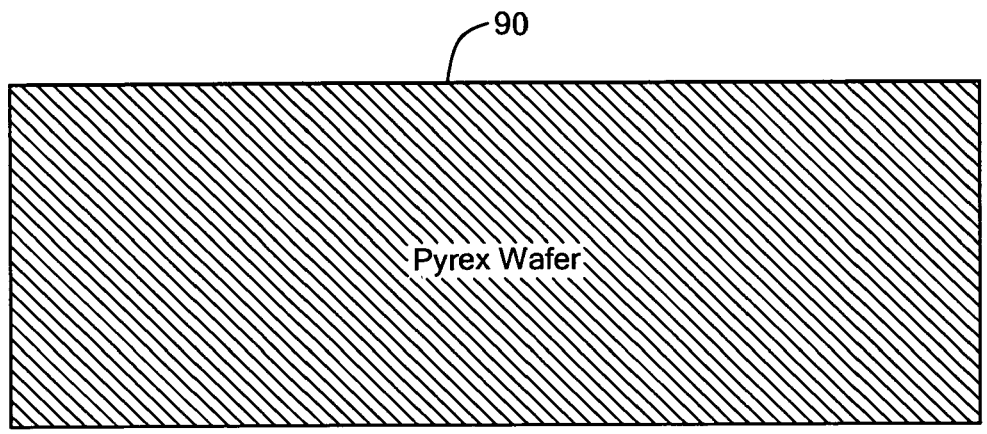
FIGS. 4A-4D are schematic cross sectional views depicting the primary steps associated with the preparation of a substrate in accordance with the subject invention.
Figure 4B:
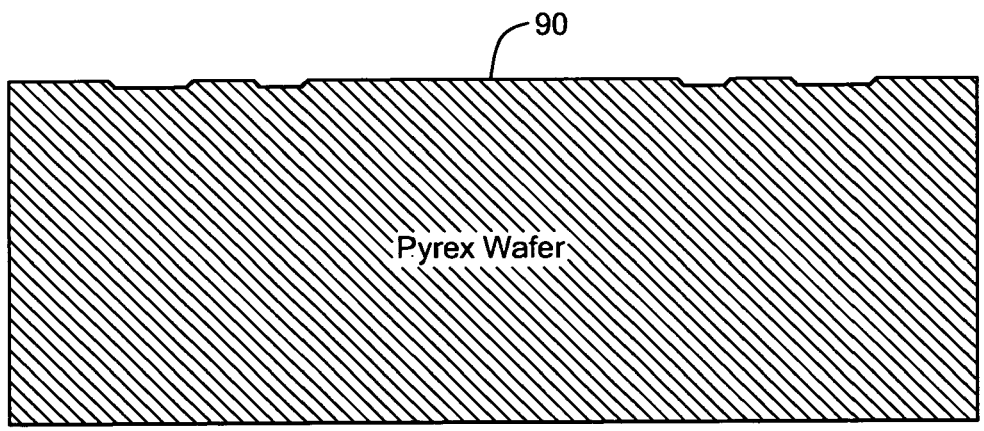
Figure 4C:
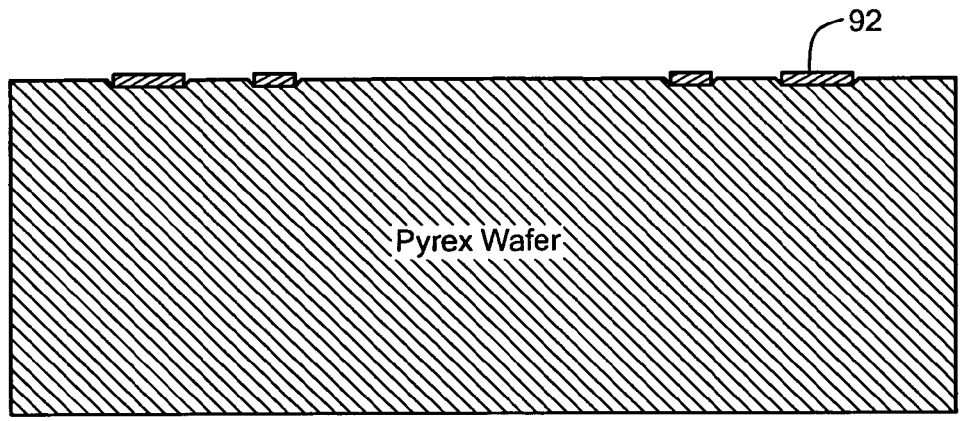
Figure 4D:
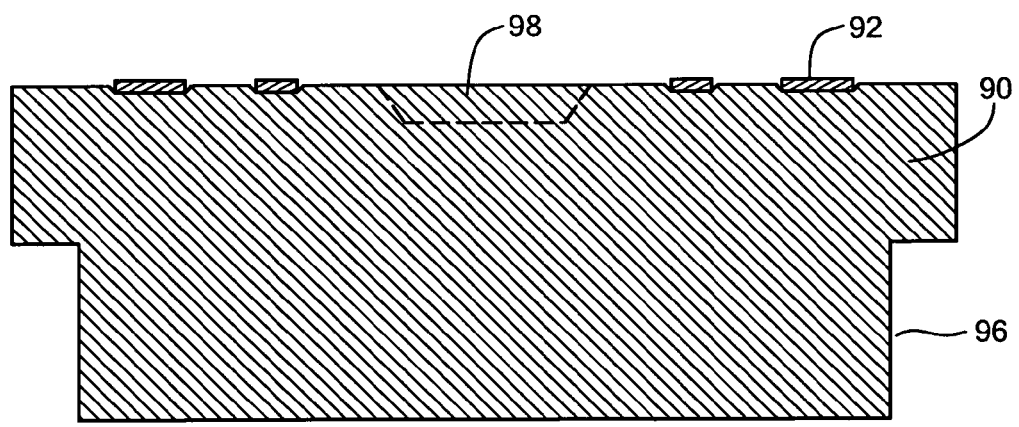

In one preferred embodiment, wafer 80, FIG. 3A, is typically homogeneous in composition, i.e., not diffused to some level with boron and not including an oxide layer. In one example, wafer 80 is a standard silicon wafer. In other embodiments, wafer 80 is a double-side polished boron doped silicon wafer. But doped or undoped silicon wafers can be used. In FIG. 3B, mesa 88 (e.g., 2 µm in depth) is etched in device portion 86 using a KOH etch to define the suspended elements of an accelerometer. Portion 82 of wafer 80 is deemed a handle portion. Device portion 86 may be greater than 50 µm thick. Then, Pyrex wafer 90, FIG. 4A, is etched as shown in FIG. 4B, and electrode material such as TiPtAu is deposited as shown at 92 in FIG. 4C forming metal patterns for sense plates, guard bands, bond pads, and dimples as necessary in the resulting MEMS device. A partial saw cut is made as shown at 96. In an alternative embodiment, mesa 98, shown in phantom, is etched in Pyrex wafer 90 rather than etching mesa 88, FIG. 3B, in SOI wafer 80.

Figure 5A:
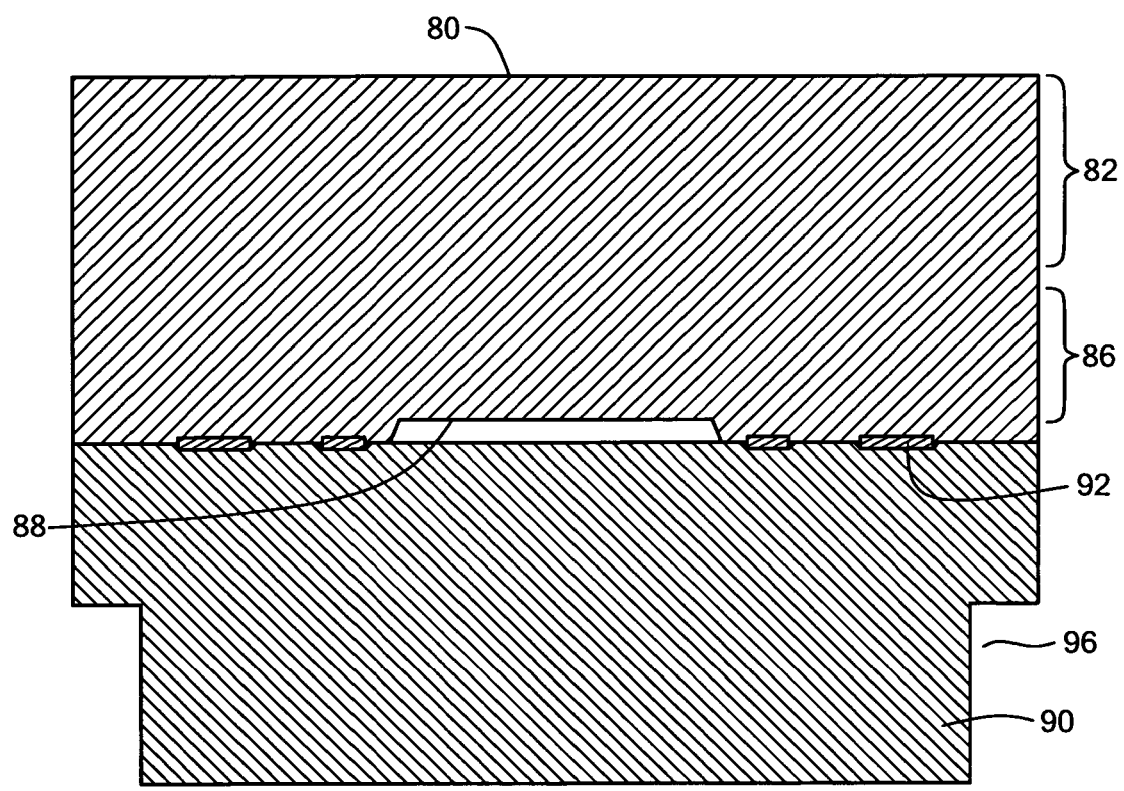
FIGS. 5A-5D are schematic cross sectional views showing the primary steps associated with the bond and etch back fabrication process of the subject invention for fabricating silicon micro-mechanical devices with a thickness greater than 50 µm.
Figure 5B:
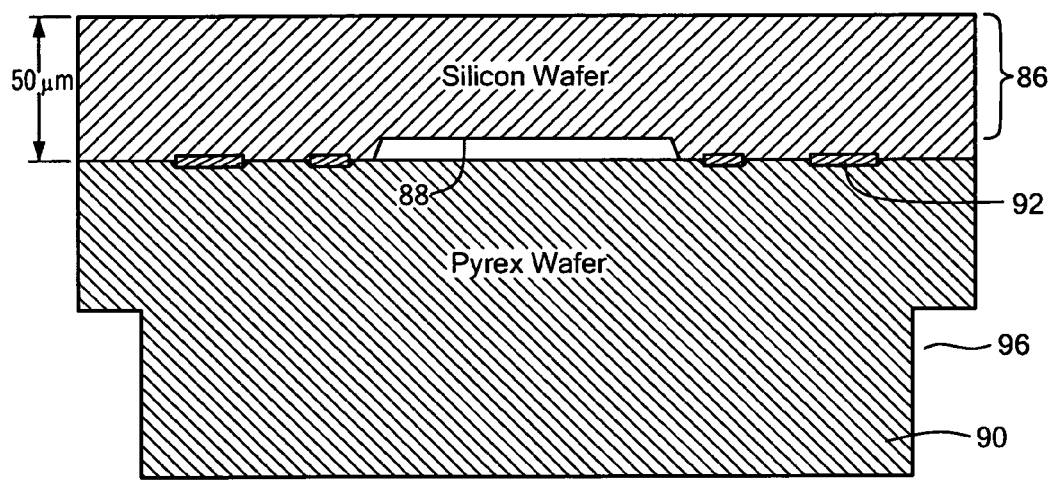

In FIG. 5A, wafer 80 is bonded to Pyrex substrate 90 using anodic bonding processes. In FIG. 5B, the handle portion of wafer 80 is removed until a desired device thickness is obtained leaving device layer 86. Wafer 80 thus is trimmed until the desired device thickness is obtained before the structural etch is performed. The wafer thinning process may be performed in multiple steps to approach a desired thickness (e.g., 50-70 µm) within +/−1 µm accuracy. A wet etch, such as KOH, TMAH, or EDP may be used. Or, grinding may be used to remove part of handle portion 82, FIG. 5A and a dry plasma etch or a wet chemical etch may be used to remove any remaining handle portion. A seal ring may be provided to prevent etchant attack of the mesa side of the silicon device portion 86. But, note that since the structural etch has not yet been performed, any wet etch used so far does not adversely come into contact with the relief structure thereby reducing stiction.

Figure 5C:
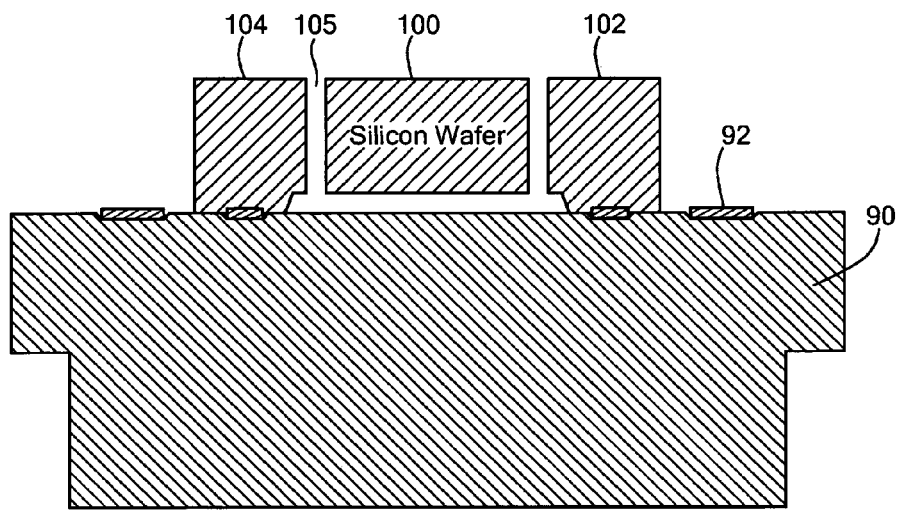

Next, in FIG. 5C, the structural etch is performed by the removing wafer material to form the discrete elements of the resulting device. Typically proof mass structure 100 is formed by forming trench 105 with deep straight sidewalls and high aspect ratios. Suspended mechanisms, other than proof mass structure 100 suspended above substrate 90 by anchors 102 and 104, however, may be formed in the same manner. Bond pads 92 are also uncovered during this structural etch as shown in FIG. 5C.

Figure 5D:
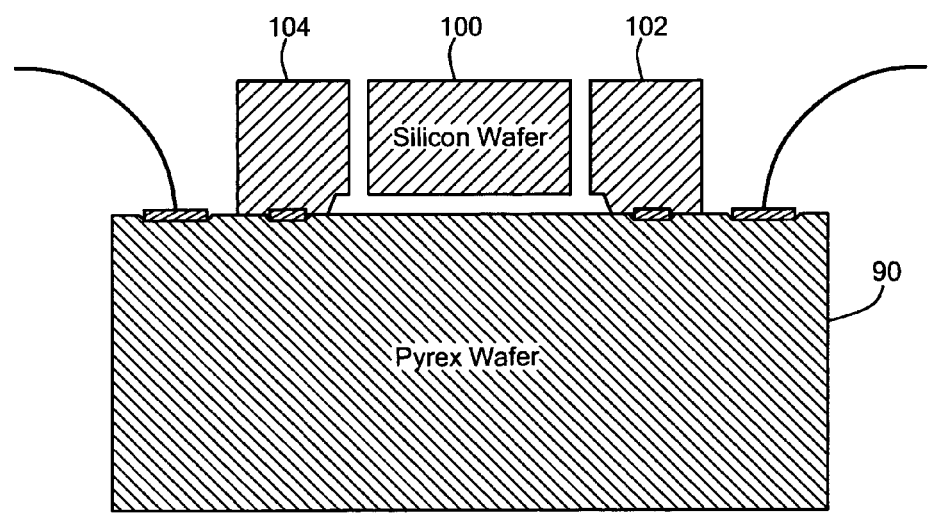

Advantageously, an STS ICP etch through wafer alignment marks using infrared alignment techniques is used. Thus, wet chemical etches never come into contact with the relief structure which assists in avoiding stiction. An REI trench etch could also be used. Wet chemical etching may also be used. In FIG. 5D, the wafer is partitioned and wire bonding operations and other finishing steps are performed.

In this way, gyroscopes, accelerometers, vibrations sensors and other MEMS devices can be fabricated with a thicker proof mass thickness not obtainable with a dissolved wafer process. Thicker micro-mechanical structures advantageously increase the mass and horizontal motion stiffness of micro-mechanical gyroscope and accelerometer designs. These properties can in turn be used to improve scale factor and resolution. Thicker structures are advantageous for micro-mechanical inertial instrument performance. Thus, the process of the subject invention can be employed to fabricate micro-mechanical gyroscopes, accelerometers, and vibration sensors used in automotive yaw rate sensing, and camcorder image stabilization as but two examples.

Figure 6:
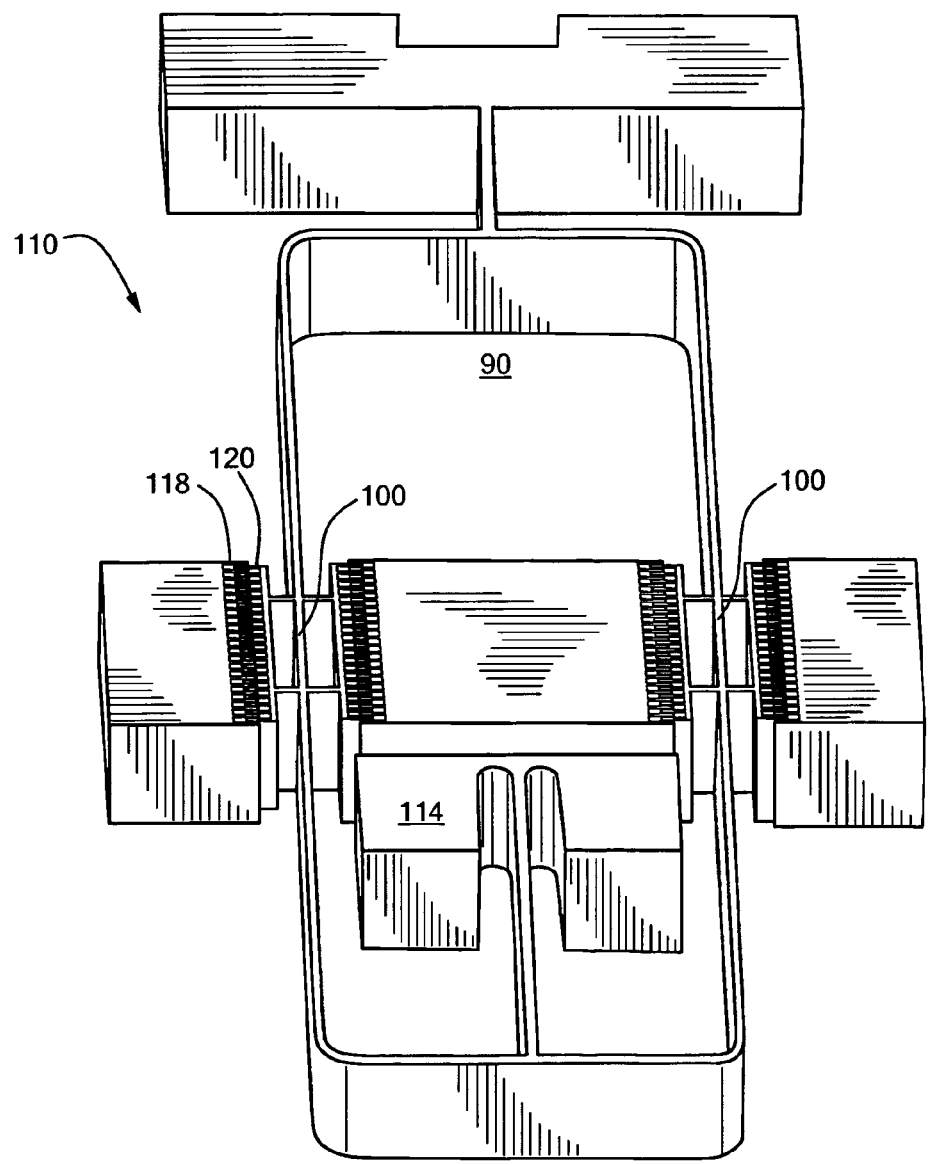
FIG. 6 is a schematic three-dimensional top view of an example of a silicon micro-mechanical device manufactured in accordance with the subject invention.

FIG. 6 shows a tuning fork resonator approximately 200 µm long. The device is 70 µm thick and the beams are 6 µm wide. The proof mass structures 110 are supported by vibrating beams 130. Two similar resonators are included in an accelerometer (not shown) where the resonators support a proof mass 5,000×5,000×70 µm$^3$. This thickness and proof mass size would not be possible without bond and etch back technique of the subject invention.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A method of fabricating micro-mechanical devices, the method comprising:
   etching a mesa in a homogenous wafer;
   bonding the wafer to a patterned substrate with the mesa defining device elements suspended above the substrate;
   removing a portion of the wafer until a desired device thickness is achieved; and
   forming discrete elements of said device by performing a structural etch on the remaining wafer material.

2. The method of claim 1 in which the wafer is a silicon wafer comprising a handle portion and a device portion.

3. The method of claim 2 in which the mesa is etched in the device portion.

4. The method of claim 2 in which removing a portion of the wafer includes removing the handle layer.

5. The method of claim 4 in which removing the handle portion includes grinding or a wet chemical etch.

6. The method of claim 1 in which a wet chemical etch is not used to form the discrete elements of the device or in any processing step after the discrete elements of this device are formed.

7. A product made in accordance with the process of claim 1.

8. A method of fabricating a micro-mechanical device including elements defined in a wafer suspended above a substrate bonded to the wafer, the method comprising:
   forming a mesa in one of a homogeneous wafer and a substrate;
   bonding the wafer to the substrate;
   removing a portion of the wafer until a desired device thickness is achieved; and
   forming discrete elements of said device by performing a structural etch on the remaining wafer material.

9. A product made by the process of claim 8.

* * * * *